United States Patent [19]
Bellows et al.

[11] Patent Number: 5,605,454
[45] Date of Patent: Feb. 25, 1997

[54] FOUR PORT TUBE TO EXTEND THE LIFE OF QUARTZ TUBES USED FOR THE WELL DRIVE PROCESS

[75] Inventors: Craig A. Bellows; Curtis M. Herbert, Jr., both of San Antonio, Tex.

[73] Assignee: VLSI Technology, Inc., San Jose, Calif.

[21] Appl. No.: 542,090

[22] Filed: Oct. 12, 1995

[51] Int. Cl.⁶ .................................................. F27D 19/00
[52] U.S. Cl. ........................ 432/50; 432/3; 432/76
[58] Field of Search ............................ 432/5, 6, 11, 152, 432/253, 18, 3, 50, 76

[56] References Cited

U.S. PATENT DOCUMENTS

| | | | |
|---|---|---|---|
| 4,943,234 | 7/1990 | Söhlbrand | 432/152 |
| 5,064,367 | 11/1991 | Philipossian | 432/253 |
| 5,254,172 | 10/1993 | Otaki et al. | 432/117 |
| 5,330,352 | 7/1994 | Watanabe et al. | 432/253 |

*Primary Examiner*—Noah P. Kamen
*Attorney, Agent, or Firm*—Majestic, Parson, Siebert & Hsue

[57] ABSTRACT

A quartz tube with multiple thermocouple ports arranged along its radius allows for the quartz tube to be rotated while the thermocouple is always placed in the bottom position of the quartz tube. This avoids a problem of the sagging of the quartz tube. When quartz tubes are not rotated, the quartz tubes tend to start sagging from their top. By rotating the quartz tube different portions of the quartz tube are at the top at different times. By using multiple thermocouple ports arranged around the radius of the quartz tube, the thermocouple can be positioned at the bottom of the quartz tube for different orientations of the quartz tube.

22 Claims, 4 Drawing Sheets

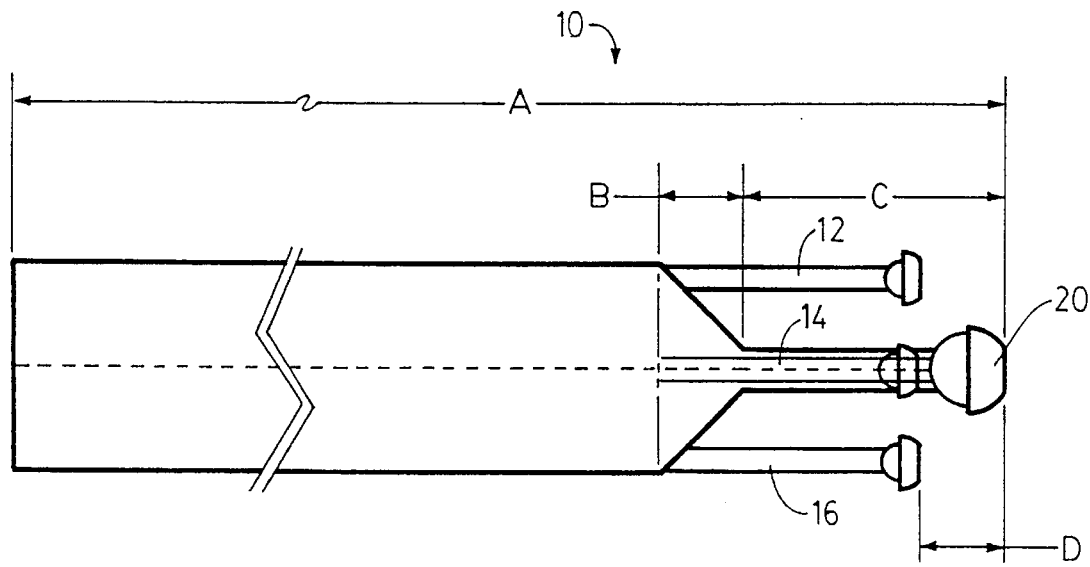
FIG._1.
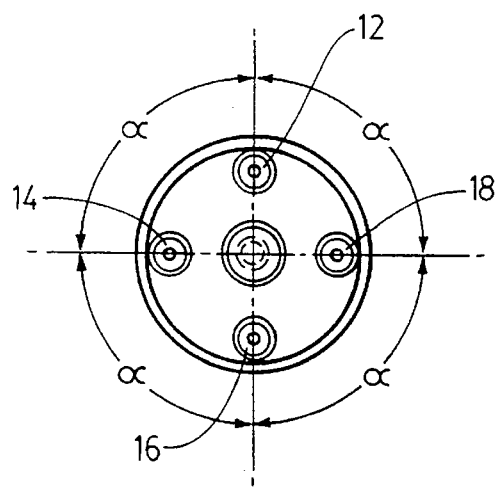
FIG._2.

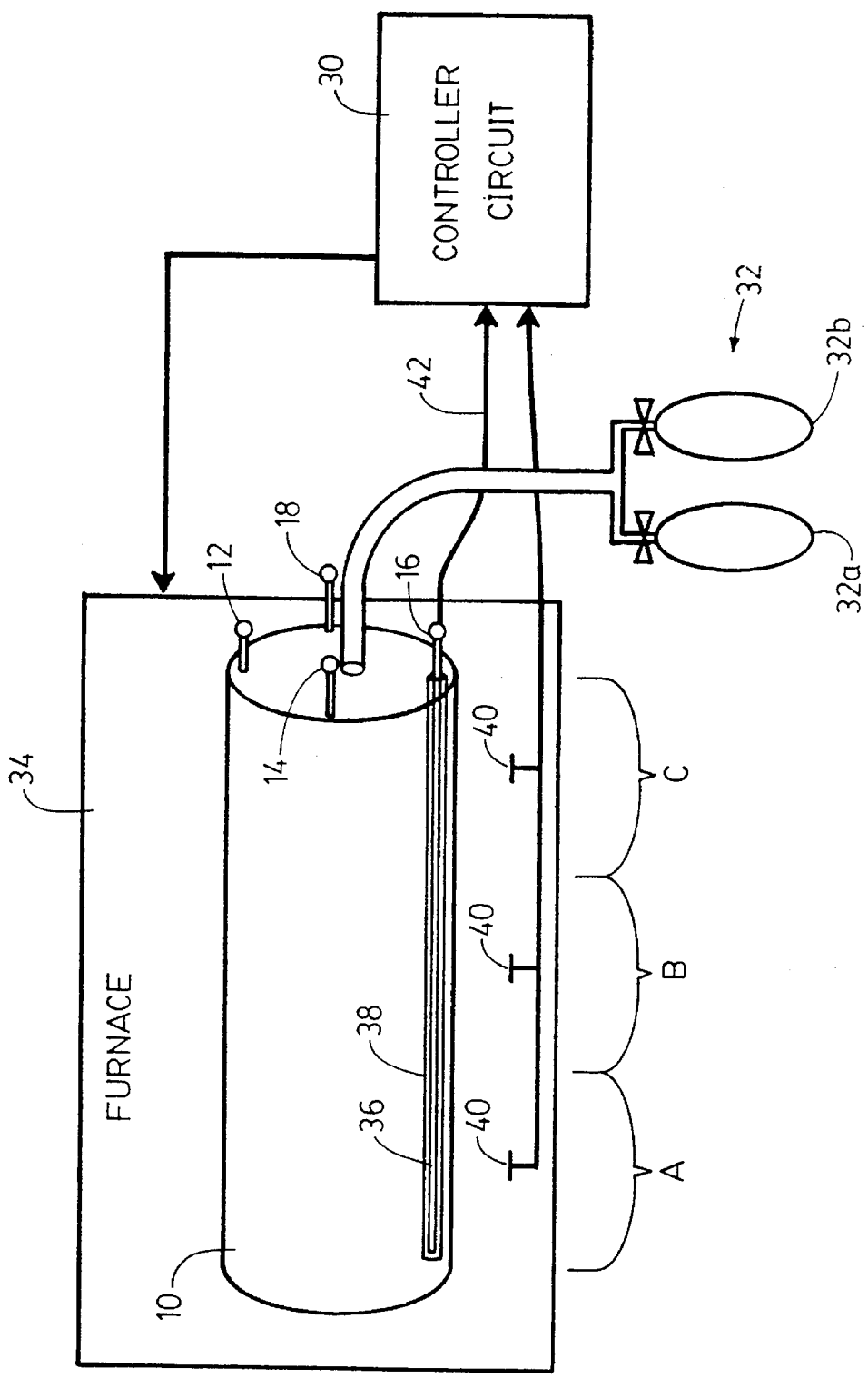
FIG._3.

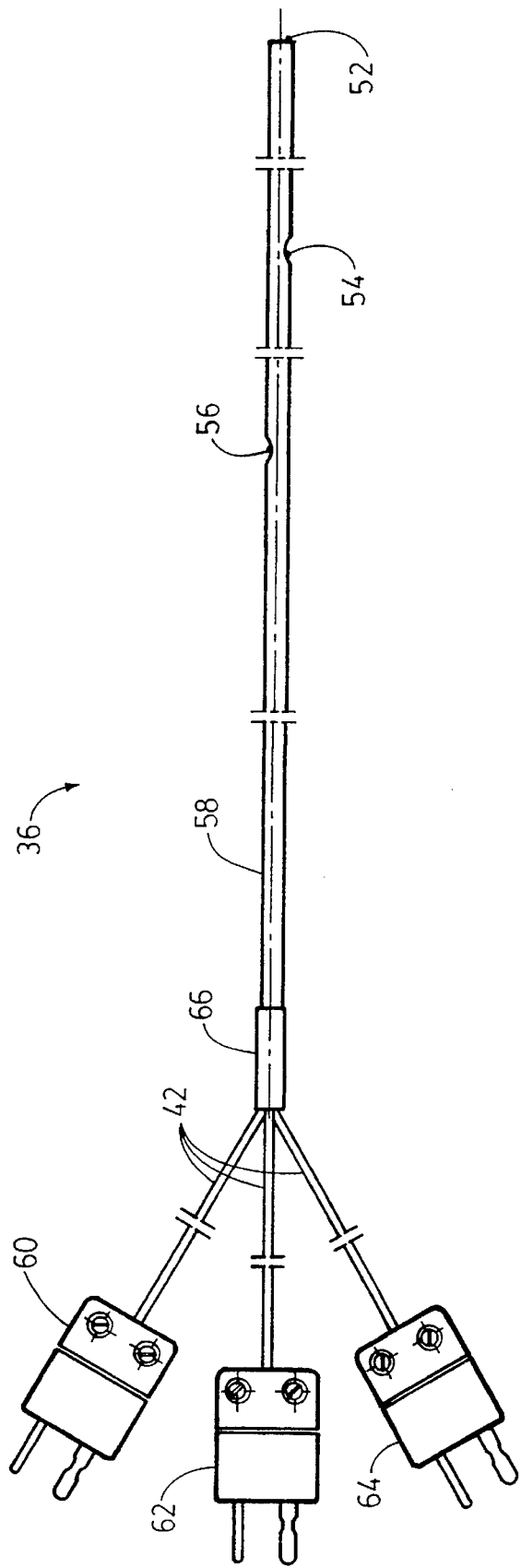
FIG._4.

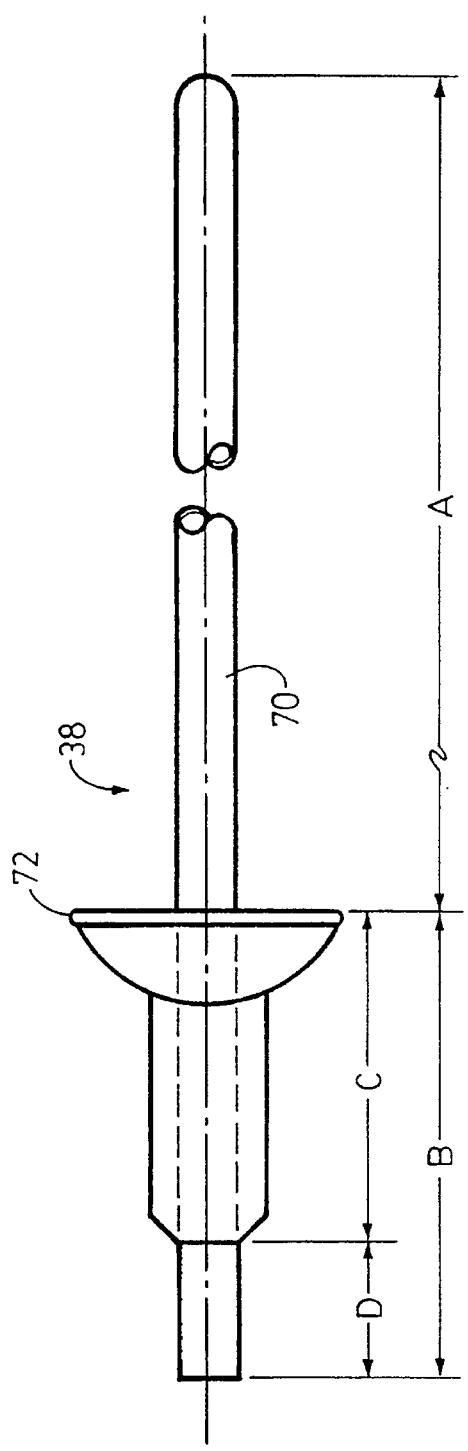
FIG._5.
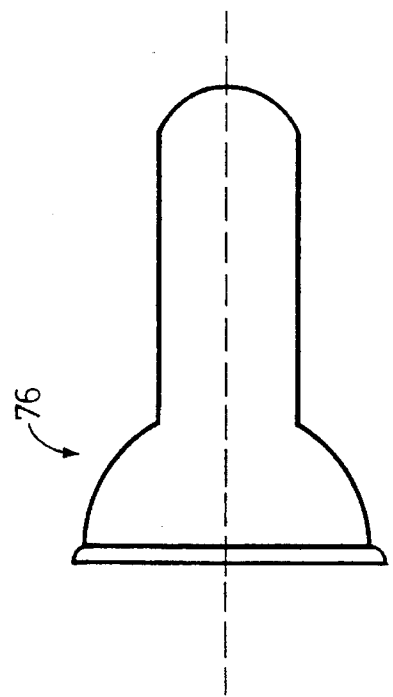
FIG._6.

FOUR PORT TUBE TO EXTEND THE LIFE OF QUARTZ TUBES USED FOR THE WELL DRIVE PROCESS

BACKGROUND OF THE INVENTION

This invention relates to method and apparatus used for high-temperature silicon processing. More particularly, this invention relates to quartz tubes used with the high-temperature well drive process.

Typically, the well drive process uses the greatest temperatures in the processing of semiconductor wafers. In forming the well areas of a semiconductor circuit on a silicon wafer, the chips are first doped with a dopant material and then annealed at high temperatures so that the dopant material diffuses deeper into the wafer.

Furnaces are used to create the required high temperatures. The wafers are placed in quartz tubes within the furnace. The quartz tube must be kept very clean and any impurities in the chamber tube can damage the semiconductor wafer. The well drive annealing process is currently done at temperatures which are greater than quartz's 1140° C. annealing point. This means that the quartz in the tube will start to slowly flow. Typically, the top of the quartz tube will sag downward. This sagging may eventually cause the quartz to contact the wafers inside the quartz tube. For this reason, the quartz tube needs to be monitored and replaced before the quartz sags so much that it contacts the wafers. Thus, after a period which can be as little as three to six weeks, the quartz tube requires replacement.

When a quartz tube is replaced, 24 to 48 hours of requalifying tests need to be done. These tests include a capacitance/voltage testing, which takes 3 to 4 hours; a hydrogen chloride (HCl) cleansing, which typically takes 8 hours; and an 8 to 16 hour profiling of the thermocouple. Thermocouples are typically placed in each quartz tube to produce an accurate indication of the temperature at the wafers. Due to the precision required for current semiconductor processing, each new thermocouple needs to be calibrated to ensure that the readings of the temperature are accurate. Inaccurate temperature readings by the thermocouple can cause the well areas to be too large or too small and thus throw off the process control.

This 24 to 48 hours of requalifying time every 3 to 6 weeks produces a bottleneck in the wafer fabrication process. The processes that occur after the well drive annealing process (which includes most of the semiconductor processing steps) will be held up until the replaced quartz tube can be requalified.

It is desired that a method and apparatus can be determined which will produce an increased life span for the quartz tubes. This will reduce the expenses involved in replacing the quartz tubes and also reduce the down-time which results from the requalification of a new quartz tube.

SUMMARY OF THE PRESENT INVENTION

Ten years ago, the lifespan of quartz tubes could be increased by regularly rotating the quartz tubes. This cannot be done with the quartz tubes that are now available since these current quartz tubes use a profile thermocouple to accurately determine the temperature within the quartz tube. The profile thermocouple allows for the temperatures within the quartz tube to be accurately maintained. This is important since the control of the diffusion depends upon the accurate control of the temperatures of the annealing step.

The present invention concerns the use of a quartz tube with multiple thermocouple ports along its radius so that the tubes may be rotated into different positions and a thermocouple can always be positioned at the bottom of the quartz tube. The thermocouple needs to be at the bottom of the quartz tube since in that position, the thermocouple can rest upon the bottom of the tube. Otherwise, the thermocouple would need to be held in place by a quartz loop which would necessarily be thinner than the quartz tube itself, and thus may sag or fail.

In a preferred embodiment, the thermocouple is sheathed in a quartz sheath and whenever the quartz tube is rotated to a new position the thermocouple with sheath is pulled out, and repositioned into the port that is currently at the bottom of the quartz tube. Rotating the quartz tube means that one portion of the quartz tube is not always at the top of the quartz tube and thus susceptible to sagging. The ports are preferably at a uniform angle from one another. In a preferred embodiment, there are four ports for the thermocouple which are at an 90° angle from one another.

In a preferred embodiment of the method, the quartz tubes are rotated at least once every 2 weeks. It was found that the top of the quartz tube can sag so much that it will make rotation of the tube difficult after a period as short as 2 weeks. Preferably, the quartz tube is rotated once every week.

Rotating the quartz tube takes about 10 to 15 minutes to remove the thermocouple, rotate the tube and replace the thermocouple in the new position. It then takes about 6 hours to do a test of the system in this new configuration.

It is found that quartz tubes when they are rotated once a week last 6 months or greater. It may be that the life of the quartz tube is expanded even more than 4 positions × 6 weeks/per position, since after rotating the tube to a new position, portions of the tube that were at the top of the tube will be at the bottom of the tube and will tend to sag back into the correct position.

It is possible that a quartz tube could have a thermocouple for each port but this would be expensive and it would be hard to hold the thermocouples which are at the top of the tube in place. Additionally, each of the four thermocouples would need to be individually profiled to ensure that they give the correct temperature readings.

The use of multiple thermocouple ports and rotating the quartz tubes allows for the use of a quartz tube rather than silicon carbide tubes. Silicon carbide tubes are dirtier and more expensive than quartz tubes, but they do not reflow at temperatures around 1200° C.

BRIEF DESCRIPTION OF THE DRAWINGS

The above and other features and aspects of the present invention will become more apparent upon reading the following detailed description in conjunction with the accompanying drawings.

FIG. 1 is a side view of a quartz tube of the present invention showing multiple ports for a thermocouple.

FIG. 2 is a front view of the quartz tube of FIG. 1.

FIG. 3 is a diagram of a quartz tube, a furnace, controller and a gas supply.

FIG. 4 is a diagram of a thermocouple.

FIG. 5 is a diagram of a sheath for the thermocouple of FIG. 4.

FIG. 6 is a diagram of a stopper for the other ports that do not contain a thermocouple.

DETAILED DESCRIPTION OF THE PREFERRED EMBODIMENT

FIG. 1 is a side view of the quartz tube 10 of the present invention showing multiple thermocouple ports 12, 14 and 16. In this view, a fourth thermocouple port 18 cannot be seen. The quartz tube 10 also has a central port 20 through which the gases are supplied. In a preferred embodiment, the dimensions for the quartz tube are as follows. The length of the quartz tube, A, is 82 inches. The length of the V-neck, B, is at maximum 1.5 inches The length of the central port 20, C, is 7.5 inches. The central port 20 extends a distance, D, 2.25 inches from the ends of the thermocouple ports 12, 14 and 16. The central portion of the quartz tube has an outer diameter of 238 millimeters and an inner diameter of 220 millimeters. The central gas port 20 has an outer diameter of 22.5 millimeters and an inner diameter of 20 millimeters. The four thermocouple ports have outer diameters of 18 millimeters and inner diameters of 15 millimeters. A 28–15 ball joint is positioned on the thermocouple ports and a 35–20 ball joint is positioned on the central gas port.

FIG. 2 is an end view of the quartz tube of FIG. 1. As shown in FIG. 2, the four thermocouple ports are positioned at an angle, α, 90° from one another. There may be more or less than four ports. The preferred angle between the thermocouple ports depends on the number of thermocouple ports. The quartz tubes used in the annealing process are available from Quartz International Corporation of Carolton, Tex.

FIG. 4 is a diagram of a thermocouple 36 for use with the quartz tube. The thermocouple 36 has three junctions 52, 54, and 56 that are spaced to give an indication of the temperature of different zones in the quartz tube. The junctions are connected by wires and encased in a ceramic portion 58. The thermocouple 36 also includes wires 42, connectors 60, 62 and 64, and shrinkwrapped portion 66. The thermocouple 36 is preferably one such as a tri-junction thermocouple X35 available from Johnson Matthey of San Jose, Calif.

FIG. 5 is a diagram of a sheath 38 for the thermocouple of FIG. 4. The sheath 38 includes a socket 72 and tube section 70 closed off at its end. In a preferred embodiment, the socket is a 28/15 socket; the inner diameter of the tube section 70 is 8 millimeters and the outer diameter is 10 millimeters; and the length, A, of the tube section 70 is 59 inches. In this preferred embodiment, length B is 5.25 inches; length C is 3.75 inches; and length D is 1.5 inches.

FIG. 6 is a diagram of a stopper 76 for the other ports that do not contain the thermocouple. In a preferred embodiment, the stopper includes a 28/15 socket and is 2 inches long.

FIG. 3 is a diagram of quartz tube 10, controller circuit 30, furnace 34 and gas supply 32. The furnace is preferably a horizontal furnace such as the Thermco TMX 10,000 available from Thermco, a division of SVG. Thermco is located in Orange, Calif. The thermocouple 36 in the quartz sheath 38 is positioned through the bottom port 16. The thermocouple 36 and the sheath 38 rests on the bottom of the quartz tube 10.

The thermocouple is called a profile thermocouple because it was originally temporarily placed within the quartz tube in order to calibrate the spike thermocouples 40 positioned outside the quartz tube in the furnace. As the process control requirements got narrower, a thermocouple was required to be maintained within the quartz-tube at all times during the process. The thermocouple produces a signal over the wires 42 to the controller circuit 30. In the preferred embodiment, three temperature indications are produced by the thermocouple, an indication for zones A, B and C as shown. This ensures the uniformity of temperature within the quartz tube. The spike thermocouples 40 are used for the gross control of the furnace 34 temperature. The thermocouple ports that are not in the bottom position are stoppered. Tubes 12, 14 and 18 are stoppered in the position shown in FIG. 3. The quartz stopper is attached to the thermocouple port using a metal clamp on the outside so that no metal is exposed to the interior of the quartz tube.

The user sets the desired temperature and duration with controller circuit 30. The control circuit 30 receives data from the thermocouples 36 and 40 in order to control the temperature of furnace 34. Gas supply 32 includes nitrogen tank 32a and oxygen tank 32b. The quartz tube is supplied with nitrogen and a small amount of oxygen during the annealing process. Every week or so the quartz tube within the furnace is rotated and the thermocouple placed in the new bottom thermocouple port. For example, after a week, the quartz tube 10 can be rotated such that port 14 is at the bottom position. In a preferred embodiment, the annealing process takes about 6 hours at 1200° C. and the quartz tube is used for about twenty of these 6 hour periods during the week before the quartz tube is rotated. Rotating the quartz tube requires 10 to 15 minutes to exchange the position of the thermocouple in its sheath and about 6 hours to do standard tests. Tests of this invention have determined that rotating the quartz tube and repositioning the thermocouple does not affect the well diffusion process.

Various details of the implementation and method are merely illustrative of the invention. It will be understood that various changes in such details may be within the scope of the invention, which is to be limited only by the appended claims.

What is claimed is:

1. A device for use with a semiconductor processing apparatus, the semiconductor processing apparatus using a thermocouple, the device comprising:

a quartz tube elongated along a longitudinal axis, the quartz tube having multiple ports arranged at different positions on the radius of the quartz tube, the ports being arranged to orient objects placed into the tube through the ports in a direction along the longitudinal axis of the tube, the quartz tube being such that when each port is in a bottom position, an elongated thermocouple can be placed into quartz tube through the port in the bottom position in a direction along the longitudinal axis of the tube.

2. The device of claim 1, wherein the ports are positioned about the radius of the quartz tube such that the angles defined from the center of the quartz tube to each pair of neighboring ports is the same.

3. The device of claim 2, wherein there are four ports which are positioned about the radius of the quartz tube such that a 90° angle is defined from the center of the quartz tube to each pair of neighboring ports.

4. The device of claim 1, wherein the quartz tube has four ports.

5. The device of claim 1, wherein the ports include a cylindrical portion arranged to orient objects placed into the tube through the port in a direction along the longitudinal axis of the tube.

6. The device of claim 1, wherein the ports are located on an end of the tube.

7. A semiconductor processing device comprising:

a furnace;

a quartz tube located in the furnace, the quartz tube having multiple ports arranged at different positions on the radius of the quartz tube, the ports being such that when each port is in a bottom position, an elongated thermocouple can be placed into quartz tube through the port in the bottom position, the quartz tube being arranged so that one of the ports is currently in the bottom position, and a thermocouple positioned in the port that is currently in the bottom position, the thermocouple providing information that aids in controlling the temperature in the furnace.

8. The device of claim 7, wherein the thermocouple is surrounded by a quartz sheath.

9. The device of claim 7, wherein the other ports of the quartz tube other than the port that is currently in the bottom position is covered by a quartz stopper.

10. The device of claim 7, wherein the thermocouple provides information about the temperature of more than one zone in the quartz tube.

11. The device of claim 7, wherein the ports are positioned about the radius of the quartz tube such that the angles defined from the center of the quartz tube to each pair of neighboring ports is the same.

12. The device of claim 11, wherein there are four ports which are positioned about the radius of the quartz tube such that a 90° angle is defined from the center of the quartz tube to each pair of neighboring ports.

13. The device of claim 7, wherein the quartz tube has four ports.

14. A method of using a semiconductor processing apparatus, the method comprising the steps of:

providing a quartz tube, the quartz tube having multiple ports arranged at different positions on the radius of the quartz tube, the ports being such that when each port is in a bottom position, an elongated thermocouple can be placed into quartz tube through the port in the bottom position;

positioning the quartz tube so that one of the ports is currently in the bottom position and placing a thermocouple into the one of the ports currently in the bottom position providing heat to the quartz tube; and thereafter, rotating the quartz tube so that another port of the quartz tube is in the bottom position and placing the thermocouple into this another port of the quartz tube.

15. The method of claim 14, wherein the heat providing step comprises providing heat at a temperature greater than the annealing point of quartz.

16. The method of claim 15, wherein the heat providing step comprises providing heat at a temperature of around 1200° C.

17. The method of claim 15, wherein the rotating step is done before the quartz tube begins to noticeably sag as a result of the heat providing step.

18. The method of claim 14, wherein in the thermocouple placing step the thermocouple is covered in a quartz sheath.

19. The method of claim 14, further comprising the step of regularly rotating the quartz tube so that a different port is in the bottom position and placing the thermocouple into this different position.

20. The method of claim 19, wherein the regularly rotating step comprises rotating the quartz tube so that a different port is in the bottom position and placing the thermocouple into this different position, at least once every two weeks.

21. The method of claim 20, wherein the regularly rotating step comprises rotating the quartz tube so that a different port is in the bottom position and placing the thermocouple into this different position, about once a week.

22. The method of claim 14, wherein the providing step is such that the quartz tube has four ports which are positioned about the radius of the quartz tube such that a 90° angle is defined from the center of the quartz tube to each pair of neighboring ports, and wherein the rotating step comprises rotating the quartz tube 90°.

* * * * *